United States Patent
Jing

(10) Patent No.: US 10,590,526 B2
(45) Date of Patent: Mar. 17, 2020

(54) PRESSURIZED SPRAY DEPOSITION DEVICE AND METHOD FOR AN ORGANIC MATERIAL STEAM

(71) Applicants: BOE TECHNOLOGY GROUP CO., LTD., Beijing (CN); HEFEI BOE OPTOELECTRONICS TECHNOLOGY CO., LTD., Heifei, Anhui (CN)

(72) Inventor: Yangkun Jing, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 29 days.

(21) Appl. No.: 14/912,910

(22) PCT Filed: Aug. 13, 2015

(86) PCT No.: PCT/CN2015/086857
§ 371 (c)(1),
(2) Date: Feb. 18, 2016

(87) PCT Pub. No.: WO2016/141673
PCT Pub. Date: Sep. 15, 2016

(65) Prior Publication Data
US 2017/0037503 A1    Feb. 9, 2017

(30) Foreign Application Priority Data
Mar. 10, 2015    (CN) .......................... 2015 1 0105191

(51) Int. Cl.
*C23C 14/12* (2006.01)
*B05C 5/00* (2006.01)
(Continued)

(52) U.S. Cl.
CPC ................ *C23C 14/12* (2013.01); *B05B 7/16* (2013.01); *B05C 5/00* (2013.01); *C23C 14/228* (2013.01);
(Continued)

(58) Field of Classification Search
USPC ........ 118/300, 313–315, 302, 666, 667, 692, 118/58, 69, 684; 427/427.1, 255.23
See application file for complete search history.

(56) References Cited

U.S. PATENT DOCUMENTS 6,164,933 A  * 12/2000 Tani ..................... A61B 5/0235
                                                     417/413.2
7,744,957 B2 *  6/2010 Forrest .................... C23C 14/12
                                                        427/249.1
(Continued)

FOREIGN PATENT DOCUMENTS

CN        2446511 Y  *  9/2001
CN      101560639       10/2009
(Continued)

OTHER PUBLICATIONS

English Translation CN2446511 Y, Sep. 5, 2001. (Year: 2001).*
(Continued)

*Primary Examiner* — Yewebdar T Tadesse
(74) *Attorney, Agent, or Firm* — Womble Bond Dickinson (US) LLP

(57) ABSTRACT

The invention relates to the technical field of display, particularly a pressurized spray deposition device and method for an organic material steam. The pressurized spray deposition device comprises an uniform-pressure mixing chamber, an organic material steam source, a high-pressure carrier gas feeding device, a piezoelectric pressurizing device and a nozzle, wherein the organic material steam source and the high-pressure carrier gas feeding device are
(Continued)

respectively connected with the uniform-pressure mixing chamber, and an outlet of the uniform-pressure mixing chamber is connected with the nozzle through the piezoelectric pressurizing device. The organic material steam in the organic material steam source enters the uniform-pressure mixing chamber and is mixed with the introduced carrier gas to form a carried gas mixture. Under the action of the piezoelectric pressurizing device, the carried gas mixture is sprayed at a high speed from the nozzle via the piezoelectric pressurizing device to form a highly collimated jet. The jet impacts the deposition substrate, so that the deposition substrate selectively physically absorbs the organic material molecules, and the carrier gas escapes, forming an organic film with higher resolution, while avoiding the problem of waste of organic materials caused by the mask.

12 Claims, 4 Drawing Sheets

(51) Int. Cl.

| | | |
|---|---|---|
| *B05B 7/16* | (2006.01) | |
| *C23C 14/24* | (2006.01) | |
| *C23C 14/22* | (2006.01) | |
| *H01L 51/00* | (2006.01) | |
| *C23C 14/54* | (2006.01) | |

(52) U.S. Cl.
CPC .............. *C23C 14/24* (2013.01); *C23C 14/54* (2013.01); *H01L 51/00* (2013.01)

(56) References Cited

U.S. PATENT DOCUMENTS

| | | | |
|---|---|---|---|
| 2005/0016463 A1 | 1/2005 | Hirano | |
| 2005/0030503 A1* | 2/2005 | De Weerdt | G03F 7/70758 355/53 |
| 2006/0028908 A1* | 2/2006 | Suriadi | B01F 13/0079 366/146 |
| 2009/0214782 A1* | 8/2009 | Forrest | C23C 14/12 427/255.6 |
| 2012/0325925 A1* | 12/2012 | Ivaldi | B05B 17/0646 239/4 |
| 2013/0071959 A1* | 3/2013 | Forrest | H01L 51/0004 438/22 |
| 2014/0267478 A1* | 9/2014 | Yokoyama | B41J 2/14201 347/9 |

FOREIGN PATENT DOCUMENTS

| | | |
|---|---|---|
| CN | 203904443 | 10/2014 |
| CN | 104294220 | 1/2015 |
| CN | 104651781 | 5/2015 |

OTHER PUBLICATIONS

Office Action in Chinese Application No. 201510105191.2 dated Apr. 25, 2017, with English translation.
International Search Report and Written Opinion with English Language Translation, dated Dec. 21, 2015, Application No. PCT/CN2015/086857.
Li, E.Q., et al., "Design and fabrication of a PET/PTFE-based piezoelectric squeeze mode drop-on-demand inkjet printhead with interchangeable nozzle", *Sensors and Actuators A: Physical*, vol. 163, (Jul. 30, 2010), 316.
Office Action in Chinese Application No. 201510105191.2 dated Sep. 23, 2016, with English translation. 11 pages.
Li et al. "Design and fabrication of a PET/PTFE-based piezoelectric squeeze mode drop-on-demand inkjet printhead with interchangeable nozzle." Sensors and Actuators A 163 (2010), pp. 315-322.
Chinese Office Action with English Language Translation, dated Oct. 11, 2017, Chinese Application No. 201510105191.2.
"Decision of Rejection," CN Application No. 201510105191.2 (dated Mar. 20, 2018).

* cited by examiner

PRESSURIZED SPRAY DEPOSITION DEVICE AND METHOD FOR AN ORGANIC MATERIAL STEAM

TECHNICAL FIELD

The present invention relates to the technical field of display, in particular to a pressurized spray deposition device and method for an organic material steam.

BACKGROUND

Currently, photovoltaic devices made of organic materials become popular, and many materials for making this kind of device are relatively inexpensive, so compared with inorganic devices, organic photovoltaic devices potentially have an advantage of cost. In addition, the inherent properties of organic materials, such as their flexibility, may make them be suited well for a particular application, such as fabrication on a flexible substrate. The instances of the organic photovoltaic devices include organic light emitting device (OLED), organic phototransistors, organic photovoltaic cells and organic light detector. For OLED, the organic material can have performance advantages with respect to conventional materials. For example, usually the wavelength of the light emitted by the organic emitting layer can be easily fine-tuned by employing suitable dopant. As used herein, the term "organic material" includes Polymer materials and small molecule organic materials which can be used for manufacturing an organic photoelectric device.

Common organic photoelectric devices, such as thin-film transistor (TFT), light emitting diode (LED) and Photovoltaic (PV) cell, in the past decade, gain considerable attentions of the researchers. The organic semiconductor can be deposited on various substrates, which compared to inorganic semiconductor, would potentially simplify the manufacturing processes and reduce the manufacturing cost. However, the unique processing requirements for the organic semiconductor may limit its application. For example, light emitting devices and PV cells (photovoltaic cells) typically consist of conjugated polymer or monomer film sandwiched between the conductive electrodes. For full color display and multiple transistor circuits, the active organic layer itself must also be laterally patterned. However, the organic layer formed by the existing processing method is typically too brittle, so that cannot tolerate conventional semiconductor processing method, such as photolithography, plasma processing or reactive ion etching. Thus, in the prior art there are many manufacturing and patterning techniques to overcome the problem of fragile organic layers, and these prior arts mainly focus on the easy degree and low cost of processing, and typically include organic film deposition processing ways with a mask and organic film deposition processing ways without a mask.

The existing devices and methods for organic material deposition typically perform deposition by a mask. As shown in FIG. 1, a mask 2 is provided between the sprinkler element 1 and the deposition substrate 3, but this processing way results in serious waste of the organic material deposited on the mask, and the distance existing between the substrate and the mask will cause some spread of the organic material when being deposited (the resolution of the pattern is determined partially by the nozzles and the intervals between the nozzles and the substrate), which in turn results in a lower resolution of the organic film formed. Another kind of existing organic material deposition device is as shown in FIG. 2, therein in order to avoid the waste problem of the organic material caused by employing a mask and control the deposition uniformity of the organic material, in the employed deposition device for the organic material steam, the mask is removed and the distance between the substrate and the evaporation source is controlled within an appropriate range, so that makes the rate of diffusion of the organic material within an appropriate range. Therein, there is no a mask provided between the sprinkler 6 and the deposition substrate 3, and the outlet of the mixing chamber 4 employs a conventional sprinkler 6. But the resulting problem is that the evaporation chamber is relatively large, the deposition rate is relatively low, the organic material steam 7 is easy to spread during the deposition process, and the resolution of the organic film 7 is also not high.

Therefore, in view of the above shortages, the present invention provides a pressurized spray deposition device and method for an organic material steam.

SUMMARY

(I) Technical Problem to be Solved

The purpose of the present invention is to provide a pressurized spray deposition device for an organic material steam, to solve the existing problems of material waste, relative low deposition rate and low resolution of the organic film formed when manufacturing the photoelectric devices with traditional organic material steam deposition.

(II) Technical Solution

For solving the above technical problems, an aspect of the invention provides a pressurized spray deposition device for an organic material steam, comprising an uniform-pressure mixing chamber, an organic material steam source, a high-pressure carrier gas feeding device, a piezoelectric pressurizing device and a nozzle, the organic material steam source and the high-pressure carrier gas feeding device are respectively connected with the uniform-pressure mixing chamber, and an outlet of the uniform-pressure mixing chamber is connected with the nozzle through the piezoelectric pressurizing device.

Wherein the piezoelectric pressurizing device comprises a piezoelectric ceramic tube, an inlet valve, an outlet valve and a micro electromechanical system, the inlet and outlet valves are located at the inlet and outlet of the piezoelectric ceramic tube, the micro electromechanical system is connected with the piezoelectric ceramic tube to control the deformation of the piezoelectric ceramic tube, and the micro electromechanical system is connected with the inlet and outlet valves to control opening and closing of the inlet valve and outlet valve.

Therein, the organic material steam source comprises a source chamber and a source groove, the source chamber communicates through the source groove to the uniform-pressure mixing chamber; a control valve is provided at the outlet of the source chamber.

Therein, a heating device is provided outside of the source chamber and the source groove.

Therein, the organic material steam source comprises a first organic material steam source, a second organic material steam source and a third organic material steam source, after mixing in parallel arrangement, the first organic material steam source and the second organic material steam source mix with the third organic material steam source in parallel arrangement.

Therein, a temperature control element is further comprised, which is disposed in the uniform-pressure mixing chamber.

Therein, a translatable substrate stage for carrying the deposition substrate and a cooling system are further comprised, a plurality of the nozzles forming a nozzle group, the deposition substrate on the translatable substrate stage being disposed below the nozzle groups, the cooling system being disposed in the base below the deposition substrate.

Therein, the cooling system comprises a water-cooled element and a air-cooled element, the air-cooling element being provided below the water-cooling element; the water-cooling element is a water-cooling coiler.

A pressurized spray deposition method for an organic material steam provided by another aspect of the present invention comprises the steps of:

At S1, heating the organic material to produce an organic material steam and feeding the organic material steam to the uniform-pressure mixing chamber;

At S2, feeding carrier gas in the uniform-pressure mixing chamber, to form a carried gas mixture with the organic material steam;

At S3, in the uniform-pressure mixing chamber, regulating the temperature of the carried gas mixture by the temperature control element;

At S4, spraying the carried gas mixture which is mixed uniformly out of the nozzle and towards the deposition substrate by a piezoelectric pressurizing device.

Therein, the pressurized spray deposition method for an organic material steam further comprises the steps of:

S5, cooling the deposition substrate by the cooling system, to facilitate the organic material in the carried gas mixture forming an organic film on the deposition substrate.

(III) Beneficial Effects

The above technical solution of the present invention has the following advantages: the organic material steam in the organic material steam source enters the uniform-pressure mixing chamber and is mixed with the supplied carrier gas to form a carried gas mixture; under the action of the piezoelectric pressurizing device, the carried gas mixture is sprayed at a high speed from the nozzle via the piezoelectric pressurizing device to form a highly collimated jet; when forming an organic film pattern, the jet impacts the deposition substrate, so that the deposition substrate selectively physically absorbs the organic material molecules, and the carrier gas escapes out of the substrate, forming an organic film with higher resolution on the deposition substrate, while avoiding the waste problem of organic material caused by employing the mask.

In the figures, 1: sprinkler element; 2: mask; 3: deposition base; 4: mixing chamber; 5: deposition substrate; 6: Sprinkler; 7: organic material steam; 8: organic material steam source; 9: uniform-pressure mixing chamber; 10: high-pressure carrier gas feeding device; 11: temperature control element; 12: piezoelectric pressurizing device; 13: nozzle; 14: water-cooling element; 15: air-cooling element; 16: piezoelectric ceramic tube; 17: gas flow jet form.

SPECIFIC EMBODIMENTS

The specific embodiments of the present invention will be described in further detail below in conjunction with the accompanying drawings and the embodiments. The following embodiments are intended to illustrate the invention but not to limit the scope of the invention.

Embodiment 1

Figure 1:
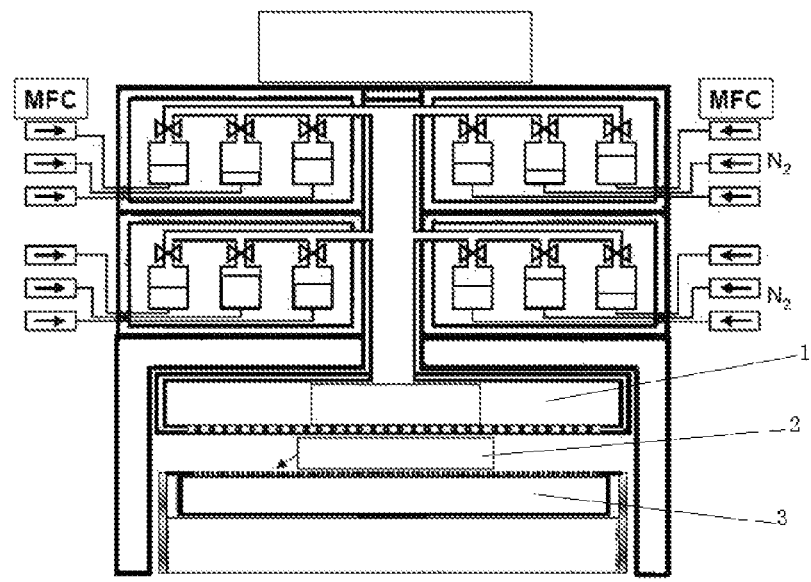
FIG. 1 is a structure schematic view of an organic material steam deposition apparatus with a mask in prior art.
Figure 2:
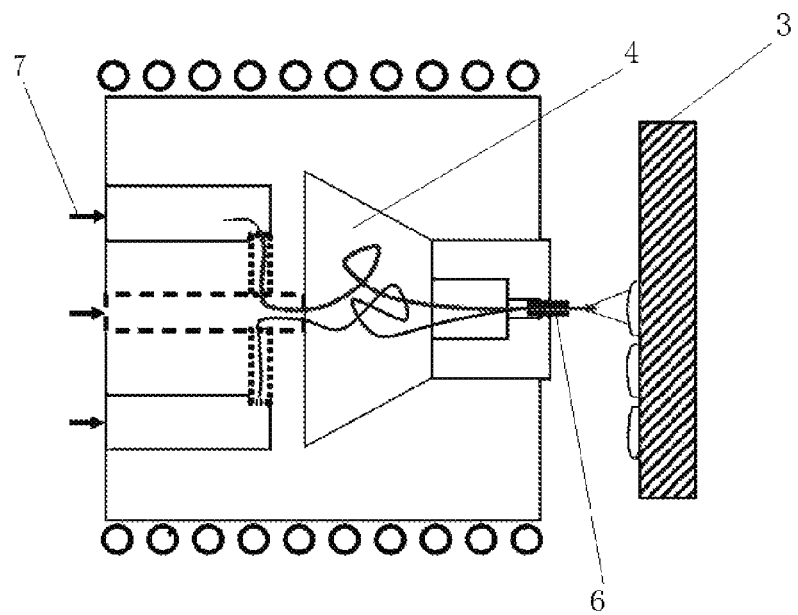
FIG. 2 is a structure schematic view of an organic material steam deposition apparatus without a mask in prior art.
Figure 3:
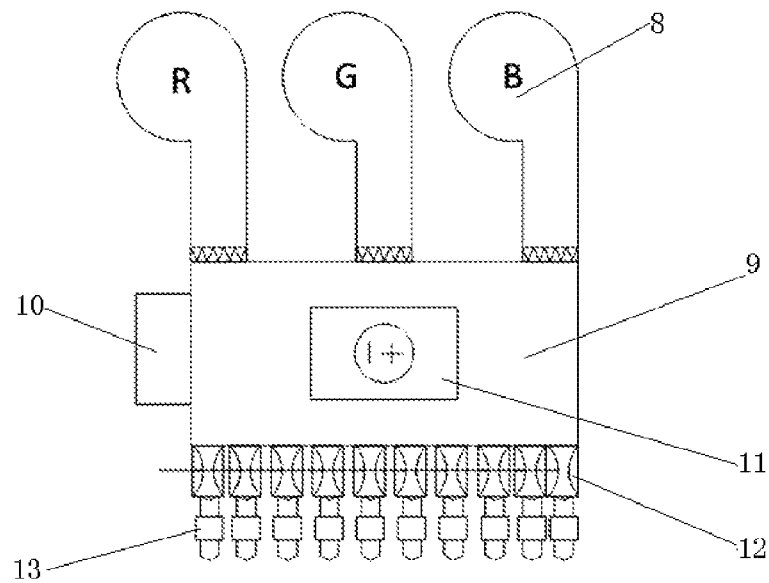
FIG. 3 is a structure schematic view of embodiment 1 of the pressurized spray deposition device for an organic material steam of the invention.
Figure 4:
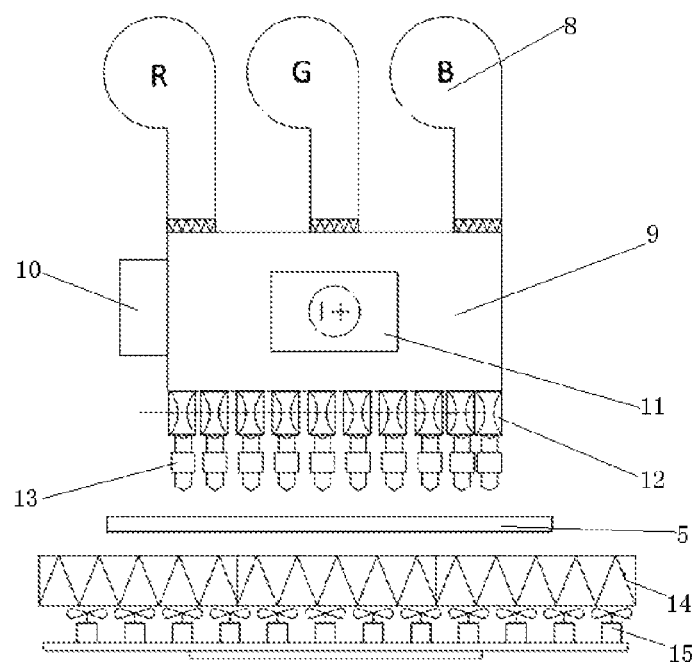
FIG. 4 is a structure schematic view of embodiment 2 of the pressurized spray deposition device for an organic material steam of the invention.

As shown in FIG. 3, the pressurized spray deposition device for an organic material steam provided by this invention includes an uniform-pressure mixing chamber 9, an organic material steam source 8, a high-pressure carrier gas feeding device 10, a piezoelectric pressurizing device 12 and a nozzle 13, the organic material steam source 8 and the high-pressure carrier gas feeding device 10 are respectively connected with the uniform-pressure mixing chamber 9, and the bottom of the uniform-pressure mixing chamber 9 is connected with the nozzle 13 through the piezoelectric pressurizing device 12. Therein, the uniform-pressure mixing chamber 9 is a hot chamber, having some heat preservation capability; for the organic material, different polymer materials or micromolecule organic materials can be chosen according to the processing requirement; the high-pressure carrier gas feeding device 10 normally employs an air pump, and the carrier gas normally employs nitrogen or other inertia gas; according to the processing requirement, the bore of the nozzle 13 is normally relatively small, to improve the resolution of the organic film pattern formed; there may be a plurality of nozzles 13 to form a nozzle group.

In above example 1, the organic material steam in the organic material steam source 8 enters the uniform-pressure mixing chamber 9. At the same time, the high pressure carrier gas feeding device 10 supplies the high pressure carrier gas to the uniform-pressure mixing chamber 9, the carrier gas mixes with the organic material steam to form a carried gas mixture. Under the action of the piezoelectric pressurizing device 12, the carried gas mixture is sprayed at a high speed from the nozzle 13 via the piezoelectric pressurizing device 12. As such, the carried gas mixture is rapidly sprayed on the deposition substrate or other deposition substrate, to form an organic film complying with the requirement, without need of the shielding of the mask, avoiding waste of the organic material. The organic film may be completely organic material, or be mixed with some dopant; therein, due to the action of the piezoelectric pressurizing device 12, the carried gas mixture is sprayed at a high pressure, which solves the pressure drop between the gas source and the nozzle 13, and avoids the problem of the steam condenses in advance before arriving at the substrate. The high speed carried gas mixture is sprayed, making the deposition rate of the organic material on the substrate relatively high and the resolution of the organic film formed relatively high also.

Figure 5:
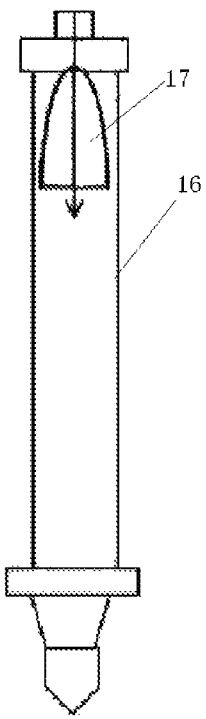
FIG. 5 is a structure schematic view of the piezoelectric pressurizing device in embodiment 1 of the pressurized spray deposition device for an organic material steam of the invention.
Figure 6:
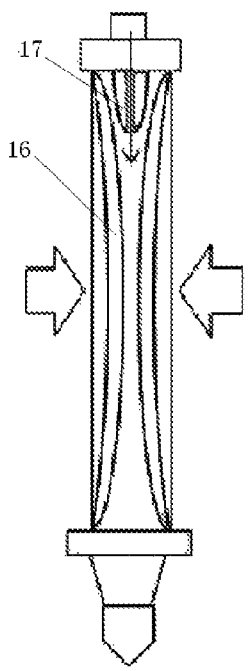
FIG. 6 is a schematic view of the working principle of the pressurizing of the piezoelectric pressurizing device in the pressurized spray deposition device for an organic material steam of the invention.
Figure 7:
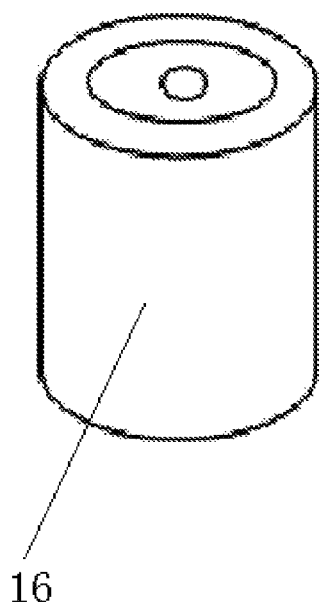
FIG. 7 is a structure schematic view of the piezoelectric ceramic tube in the pressurized spray deposition device for an organic material steam of the invention.

Specifically, as shown in FIG. 5, FIG. 6 and FIG. 7, the piezoelectric pressurizing device 12 comprises a piezoelectric ceramic tube 16, an inlet valve, an outlet valve and a micro electromechanical system, the inlet and outlet valves being located at the inlet and outlet of the piezoelectric ceramic tube 16. The micro electromechanical system is so called MEMS. The micro electromechanical system electrically connects to the piezoelectric ceramic tube 16 to control the deformation of the inner wall of the piezoelectric ceramic tube 16, and the micro electromechanical system connects to the inlet and outlet valves to control the opening and closing of the inlet and outlet valves. Therein, the micro electromechanical system generally employs some heat preservation means, such as heat bath, to regulate the temperature of the piezoelectric pressurizing device 12; by controlling the deformation of the inner wall of the piezoelectric ceramic tube 16, a pressure pulse can be generated in the organic steam deposition gas, the organic material steam is supplied to the nozzle 13 at the pulse pressure, obtaining on the deposition substrate a deposit sediment profile of more evident rectangle than when it is feeded at a constant pressure, that is, generating a more evident gauss profile, reducing deposition offset, and improving accuracy of deposition.

Specifically, the inner wall of the piezoelectric ceramic tube 16 is composed of a composite sheet piezoelectric vibrator. The composite sheet piezoelectric vibrator comprises a composite structure adhered by a driver (PZT piezoelectric wafer), a metal substrate and a sensor (PVDF piezoelectric film); the sensor and driver of the piezoelectric vibrator connect to the control power supply of the micro electromechanical system via wires respectively. When bending deformation of the driver of the piezoelectric vibrator occurs under the action of the applied voltage, the sensor is also forced to bend and generates electrical energy; after being suitably converted, the electrical energy generated by the sensor is used for high-precision characterizing the output pressure and flow rate of the piezoelectric pressurizing device.

Further, the working process of the piezoelectric pressurizing device is as follows: when the micro electromechanical system control the power supply to start and enter the steady-state operation, the driver of the piezoelectric vibrator under the action of the voltage (input voltage–$V_0 \rightarrow 0 \rightarrow V_0$) bends towards the inner cavity of the piezoelectric ceramic tube, the volume of the inner cavity of the piezoelectric ceramic tube is reduced (the fluid pressure is increased), the inlet valve is closed, the outlet valve is opened, the fluid in the cavity of the piezoelectric ceramic tube of the piezoelectric pressurizing device is expelled through the outlet valve, which is a fluid expelling process; during the fluid expelling process, the sensor of the piezoelectric vibrator also bends towards the interior of the piezoelectric ceramic tube of the piezoelectric pressurizing device along with the piezoelectric vibrator, and converts the mechanical energy into the electrical energy (the voltage gradually increases, $-V_g \rightarrow 0 \rightarrow V_g$). When the output voltage of the control power supply of the micro-electromechanical system is reversed ($V_0 \rightarrow 0 \rightarrow -V_0$), the driver makes the piezoelectric vibrator bend towards the exterior of the cavity of the piezoelectric ceramic tube, causing the volume of the cavity of the piezoelectric ceramic tube increase, the inlet valve open and the output valve close, and the fluid flow into the cavity of the piezoelectric ceramic tube from the inlet valve, which is the suction process; during the suction process, the stress state of the sensor of the piezoelectric vibrator changes, and its output voltage begins drop ($V_g \rightarrow 0 \rightarrow -V_g$).

When the frequency and driving voltage are determined, there is a relatively good linear relationship between the output flow and the output pressure of the piezoelectric pressurizing device: when the output pressure is zero, the amount of deformation of the piezoelectric vibrator (the amount of change in the volume of the piezoelectric ceramic tube or the flow rate) is largest, the corresponding output voltage of the sensor is largest; on the contrary, when the output pressure is largest, the amount of deformation of the piezoelectric vibrator (the amount of change in the volume of the piezoelectric ceramic tube or the flow rate) is smallest, and the corresponding output voltage of the sensor is smallest also. Thus, according to the output voltage of the sensor of the piezoelectric vibrator, the output pressure and the flow rate of the piezoelectric pressurizing device can be obtained.

Therein, when the piezoelectric ceramic tube 16 deforms inwardly to extrude the carrier gas mixture, the injecting of the air flow is oppressed by the tube wall, and the air flow injection form 17 becomes thinner.

Preferably, the organic material steam source 8 includes a source chamber and the source groove, the source chamber communicates through the source groove to the uniform-pressure mixing chamber 9; a control valve is provided at the outlet of the source chamber; a heating device is provided outside of the source chamber and the source groove; the source chamber is heated to produce organic steams and increase the pressure of organic steam, and the flow rate and on/off of the organic steam are controlled by the control valve.

Further, the organic material steam source 8 comprises a first organic material steam source 8, a second organic material steam source 8 and a third organic material steam source 8, after mixing in parallel arrangement, the first organic material steam source 8 and the second organic material steam source 8 mix with the third organic material steam source in parallel arrangement. The kinds of the organic materials in the above three steam sources 8 are different, and different test requirements are accommodated by means of the mating relationship of the three different organic steam sources.

Further, the present invention further comprises a temperature control element 11, the temperature control element 11 is provided in the uniform-pressure mixing chamber 9. This realizes heating of the organic material carried gas mixture after mixed, facilitates the mixing of the organic material steam and the carrier gas, and further allows the organic film product formed more compact. The heating temperature is higher than the condensation temperature of the organic steam.

Embodiment 2

As shown in FIG. 4, embodiment 2 of the invention, on the basis of embodiment 1, is further provided a translatable substrate stage for carrying the deposition substrate 5 and a cooling system, a plurality of said nozzles 13 form a nozzle group, the deposition substrate 5 on the substrate stage is disposed below the nozzle groups, the carried gas mixture is rapidly sprayed on the deposition substrate 5, to form an organic film pattern meeting the requirements; the deposition substrate 5 does not need a mask for shielding, which avoids the waste due to spraying the organic material on the mask. Of course, the organic material steam ejected from the nozzle 13 can also be directly sprayed on other deposition substrate.

The deposition substrate 5 may be mounted on a translatable substrate stage, and the translatable substrate stage may translate the deposition substrate 5 with respect to the nozzle 13.

Further, the cooling system is disposed in the substrate stage below the deposition substrate 5; the cooling system comprises a water-cooled element 14 and an air-cooled element 15, the air-cooling element 15 being provided below the water-cooling element 14; the water-cooling element 14 is a water-cooling coiler. By the cooling system, the deposition substrate 5 is cooled to a sufficient temperature, so that realizes the purpose of cooling the organic steam on the substrate.

In the above technical solution, the hot carrier gas carries the organic steam and expands while passing through the tiny nozzle 13, to form a highly collimated jet, which impacts on the cold deposition substrate, thereby resulting in the deposition substrate selectively absorbing the organic molecules rather than the carrier gas, and the deposition rate is very high. Since the invention does not employ liquid solvent, compared to the other methods, such as inkjet printing, the invention provides a relatively large freedom for choosing the substrate material and shape, thus can deposit wide range of various organic conductors and structures.

Since the present invention can accelerate the organic material to high speed through the much lighter carrier gas, it can lead to more compact and more orderly film, which film can be used in the processing window in which the high-quality film grows ultra-rapidly.

Embodiment 3

A pressurized spray deposition method for an organic material steam provided by another aspect of the present invention includes the steps of:

At S1, heating the organic material to produce an organic material steam and feeding the organic material steam to the uniform-pressure mixing chamber 9;

At S2, feeding carrier gas in the uniform-pressure mixing chamber 9, to form a carried gas mixture with the organic material steam;

At S3, in the uniform-pressure mixing chamber 9, regulating the temperature of the carried gas mixture by the temperature control element 11;

At S4, spraying the carried gas mixture which is mixed uniformly out of the nozzle 13 and towards the deposition substrate 5 by a piezoelectric pressurizing device 12.

The above organic material steam may have various kinds; some kinds of organic materials after inter-mixing may mix with other kinds of organic materials, for feeding into the uniform-pressure mixing chamber 9. Before the organic material steam enters the uniform-pressure mixing chamber 9, the organic material steam may be transported by a certain carrier gas.

Further, the method further includes the step S5: cooling the deposition substrate 5 by the cooling system, to facilitate the organic material in the carried gas mixture forming an organic film on the deposition substrate 5.

By the above pressurized spray deposition method for an organic material steam, the carried gas mixture can be sprayed at a high speed to form a highly collimated jet, which jet impacts the cold deposition substrate, so that the deposition substrate selectively physically absorbs the organic material molecules, and the carrier gas escapes out of the substrate. Since the carried gas mixture is rapidly sprayed on the deposition substrate 5, and the deposition substrate 5 does not need a mask for shielding, this avoids the waste due to spraying the organic material on the mask; meanwhile, the deposition rate of the organic material is relatively high, and thereby the resolution of the organic film formed is relatively high.

The above are only preferred embodiments of the present invention. It should be noted that for those ordinary skilled in the art, without departing from the principles of the present invention, several modifications and variations can be made, which modifications and variations should be considered as within the protection scope of the invention.

The invention claimed is:

1. A pressurized spray deposition device for an organic material steam, comprising an uniform-pressure mixing chamber, an organic material steam source, a high-pressure carrier gas feeding device, a piezoelectric pressurizing device and a nozzle, wherein the organic material steam source and the high-pressure carrier gas feeding device are connected to the uniform-pressure mixing chamber, an outlet of the uniform-pressure mixing chamber is connected with the nozzle through the piezoelectric pressurizing device, and the pressurized spray deposition device further comprises a temperature control element which is disposed in the uniform-pressure mixing chamber, wherein the organic material steam source comprises a first organic material steam source, a second organic material steam source and a third organic material steam source, and after mixing in parallel arrangement, the first organic material steam source and the second organic material steam source mix with the third organic material steam source in parallel arrangement, and wherein the high-pressure carrier gas feeding device is configured to feed a carrier gas to the uniform-pressure mixing chamber, and the organic material steam source is configured to feed organic material steams which are not mixed with the carrier gas to the uniform-pressure mixing chamber.

2. The pressurized spray deposition device according to claim 1, wherein the piezoelectric pressurizing device comprises a piezoelectric ceramic tube, an inlet valve, an outlet valve and a micro electromechanical system, the inlet and outlet valves are located at the inlet and outlet of the piezoelectric ceramic tube, the micro electromechanical system is connected with the piezoelectric ceramic tube to control the deformation of the piezoelectric ceramic tube, and the micro electromechanical system is connected with the inlet and outlet valves to control opening and closing of the inlet valve and outlet valve.

3. The pressurized spray deposition device according to claim 1, wherein the inner wall of the piezoelectric ceramic tube is composed of a composite sheet piezoelectric vibrator, which composite sheet piezoelectric vibrator comprises a composite structure adhered by a PZT piezoelectric wafer, a metal substrate and a PVDF piezoelectric film.

4. The pressurized spray deposition device according to claim 1, wherein the organic material steam source comprises a source chamber and a source groove, the source chamber communicates through the source groove to the uniform-pressure mixing chamber, and a control valve is provided at the outlet of the source chamber.

5. The pressurized spray deposition device according to claim 4, wherein a heating device is provided outside of the source chamber and the source groove.

6. The pressurized spray deposition device according to claim 1, further comprising a translatable substrate stage for carrying the deposition substrate and a cooling system, wherein a plurality of said nozzles form a nozzle group, the deposition substrate on the translatable substrate stage is disposed below the nozzle groups, and the cooling system is disposed in the substrate stage below the deposition substrate.

7. The pressurized spray deposition device according to claim 6, wherein the cooling system comprises a water-cooled element and air-cooled element, the air-cooling element being provided below the water-cooling element, and the water-cooling element is a water-cooling coiler.

8. The pressurized spray deposition device according to claim 1, wherein the pressurized spray deposition device comprises a plurality of organic material steam sources which are connected to the same uniform-pressure mixing chamber.

9. The pressurized spray deposition device according to claim 8, wherein the plurality of organic material steam sources are fed with different organic materials, respectively.

10. A pressurized spray deposition device for an organic material steam, comprising an uniform-pressure mixing chamber, an organic material steam source, a high-pressure carrier gas feeding device, a piezoelectric pressurizing device and a nozzle, wherein the organic material steam source and the high-pressure carrier gas feeding device are connected to the uniform-pressure mixing chamber, an outlet of the uniform-pressure mixing chamber is connected with the nozzle through the piezoelectric pressurizing device, and the pressurized spray deposition device further comprises a temperature control element which is disposed in the uniform-pressure mixing chamber,
wherein the high-pressure carrier gas feeding device is configured to feed a carrier gas to the uniform-pressure mixing chamber, and the organic material steam source is configured to feed organic material steams which are not mixed with the carrier gas to the uniform-pressure mixing chamber.

11. A method for pressurized spray deposition of an organic material steam by a pressurized spray deposition device, wherein the pressurized spray deposition deVice comprises an uniform-pressure mixing chamber, an organic material steam source, a high-pressure carrier gas feeding device, a piezoelectric pressurizing deVice and a nozzle, wherein the organic material steam source and the high-pressure carrier gas feeding deVice are connected to the uniform-pressure mixing chamber, an outlet of the uniform-pressure mixing chamber is connected with the nozzle through the piezoelectric pressurizing device, and the pressurized spray deposition deVice further comprises a temperature control element which is disposed in the uniform-pressure mixing chamber,
wherein the organic material steam source comprises a first organic material steam source, a second organic material steam source and a third organic material steam source, and after mixing in parallel arrangement, the first organic material steam source and the second organic material steam source mix with the third organic material steam source in parallel arrangement, and
wherein the high-pressure carrier gas feeding deVice is configured to feed a carrier gas to the uniform-pressure mixing chamber, and the organic material steam source is configured to feed organic material steams which are not mixed with the carrier gas to the uniform-pressure mixing chamber, the method comprising steps of:
heating the organic material to produce an organic material steam and feeding the organic material steam to the uniform-pressure mixing chamber, wherein the organic material steam source comprises a first organic material steam source, a second organic material steam source and a third organic material steam source, and after mixing in parallel arrangement, the first organic material steam source and the second organic material steam source mix with the third organic material steam source in parallel arrangement;
feeding a carrier gas to the uniform-pressure mixing chamber, to form a carried gas mixture with the organic material steam;
in the uniform-pressure mixing chamber, regulating the temperature of the carried gas mixture by the temperature control element; and
spraying the carried gas mixture which is mixed uniformly out of the nozzle and towards the deposition substrate by a piezoelectric pressurizing device.

12. The pressurized spray deposition method according to claim 11, further comprising a step of:
cooling the deposition substrate by a cooling system, to facilitate the organic material in the carried gas mixture forming an organic film on the deposition substrate.

* * * * *

UNITED STATES PATENT AND TRADEMARK OFFICE
CERTIFICATE OF CORRECTION

PATENT NO. : 10,590,526 B2
APPLICATION NO. : 14/912910
DATED : March 17, 2020
INVENTOR(S) : Yangkun Jing Page 1 of 1

It is certified that error appears in the above-identified patent and that said Letters Patent is hereby corrected as shown below:

On the Title Page

In Item (71), please delete "Heifei, Anhui" and insert -- Hefei, Anhui --.

Signed and Sealed this
Sixth Day of October, 2020

Andrei Iancu
*Director of the United States Patent and Trademark Office*